United States Patent
Yokoyama et al.

(10) Patent No.: US 11,626,527 B2
(45) Date of Patent: Apr. 11, 2023

(54) SOLAR CELL

(71) Applicant: Panasonic Intellectual Property Management Co., Ltd., Osaka (JP)

(72) Inventors: Tomoyasu Yokoyama, Osaka (JP); Kenji Kawano, Osaka (JP); Yumi Miyamoto, Tottori (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 226 days.

(21) Appl. No.: 16/432,861

(22) Filed: Jun. 5, 2019

(65) Prior Publication Data
US 2020/0020820 A1 Jan. 16, 2020

(30) Foreign Application Priority Data
Jul. 10, 2018 (JP) .............................. JP2018-130520

(51) Int. Cl.
*H01L 51/44* (2006.01)
*H01L 31/055* (2014.01)
*H01L 51/42* (2006.01)

(52) U.S. Cl.
CPC ........ *H01L 31/055* (2013.01); *H01L 51/4213* (2013.01); *H01L 51/44* (2013.01); *H01L 51/441* (2013.01)

(58) Field of Classification Search
CPC .............. H01L 51/42; H01L 51/424
See application file for complete search history.

(56) References Cited

U.S. PATENT DOCUMENTS

| 9,391,287 B1* | 7/2016 | Huang | ................ H01L 51/4213 |
| 2015/0249170 A1* | 9/2015 | Snaith | ................ H01L 31/1884 |
| | | | 136/256 |
| 2016/0218307 A1* | 7/2016 | Huang | ................ H01L 51/0028 |

FOREIGN PATENT DOCUMENTS

| CN | 106098950 A | * 11/2016 | ............. H01L 51/48 |
| JP | 2016-025170 | 2/2016 | |

(Continued)

OTHER PUBLICATIONS

Henderson et al. (2014) ("Mass Spectrometric Transmutation of Fullerenes"), Fullerenes, Nanotubes, and Carbon Nanostructures, 22:7, 663-669.*

(Continued)

*Primary Examiner* — Christina Chern
(74) *Attorney, Agent, or Firm* — McDermott Will & Emery LLP

(57) ABSTRACT

Provided is a solar cell including a first electrode, a second electrode, a light-absorbing layer located between the first electrode and the second electrode, and an intermediate layer located between the light-absorbing layer and at least one electrode selected from the group consisting of the first electrode and the second electrode. The light-absorbing layer contains a perovskite compound represented by a chemical formula $ASnX_3$ (where A is a monovalent cation and X is a halogen anion). The intermediate layer is in contact with the light-absorbing layer. The at least one electrode selected from the group consisting of the first electrode and the second electrode has light-transmissive property. The intermediate layer contains at least one selected from the group consisting of (4-(1',5'-dihydro-1'-methyl-2'H-[5,6]fullereno-C60-Ih[1,9-c]pyrrol-2'-yl)benzoic acid) and fullerene C60.

9 Claims, 5 Drawing Sheets

(56) References Cited

FOREIGN PATENT DOCUMENTS

| WO | 2017/170869 A1 | 10/2017 | | |
| WO | WO 2018085211 | * | 5/2018 | ............. H01L 51/42 |
| WO | WO-2018152494 A1 | * | 8/2018 | ............. H01L 21/02 |

OTHER PUBLICATIONS

English machine translation of Wang et al.(CN 106098950), published Nov. 9, 2016.*
Agnese Abrusci et al, "High-Performance Perovskite-Polymer Hybrid Solar Cells via Electronic Coupling with Fullerene Monolayers", Nano letters, 2013, 13, Jun. 17, 2013, 3124-3128.
Mulmudi Hemant Kumar et al., "Lead-Free Halide Perovskite Solar Cells with High Photocurrents Realized Through Vacancy Modulation", Advanced Materials, 2014, 26, Sep. 11, 2014, 7122-7127.
Marshall, Kenneth P. et al., "Tin perovskite/fullerene planar layer photovoltaics: improving the efficiency and stability of lead-free devices", Journal of Materials Chemistry A, 2015, vol. 3, No. 21, pp. 11631-11640, DOI: 10.1039/c5ta02950c.
Wojciechowski, Konrad et al., "Heterojunction Modification for Highly Efficient Organic-Inorganic Perovskite Solar Cells", ACS Nano, 2014, vol. 8, No. 12, pp. 12701-12709, DOI: 10.1021/nn505723h.

* cited by examiner

SOLAR CELL

BACKGROUND

1. Technical Field

The present disclosure relates to a solar cell.

2. Description of the Related Art

Recently, a perovskite solar cell has been researched and developed. In the perovskite solar cell, a perovskite compound represented by a chemical formula $ABX_3$ (where A is a monovalent cation, B is a divalent cation, and X is a halogen anion) is used as a light-absorbing material.

Non-Patent Literature 1 discloses that a perovskite compound represented by the chemical formula $CsSnI_3$ is used as a light-absorbing material of a perovskite solar cell. Furthermore, Non-Patent Literature 1 discloses that $TiO_2$ and an organic semiconductor referred to as Spiro-OMETAD are used as an electron transport material and a hole transport material, respectively.

Non-Patent Literature 2 discloses that a perovskite compound represented by the chemical formula $CH_3NH_3PbI_{3-x}Cl_x$ is used as a light-absorbing material of a perovskite solar cell.

CITATION LIST

Patent Literature

Patent Literature 1: Japanese Patent Application Publication No. 2016-025170A (Family: None)

Non-Patent Literature

Non-Patent Literature 1: Mulmudi Hemant Kumar et al., "Lead-Free Halide Perovskite Solar Cells with High Photocurrents Realized Through Vacancy Modulation", Advanced Materials, 2014, 26, 7122-7127

Non-Patent Literature 2: Agnese Abrusci et. al., "High-Performance Perovskite-Polymer Hybrid Solar Cells via Electronic Coupling with Fullerene Monolayers", Nano Lett., 2013, 13 (7), pp 3124-3128

SUMMARY

An object of the present disclosure is to provide a tin perovskite solar cell in which the open voltage thereof is further improved.

The solar cell according to the present disclosure comprises:

a first electrode;
a second electrode;
a light-absorbing layer located between the first electrode and the second electrode; and
an intermediate layer located between the light-absorbing layer and at least one electrode selected from the group consisting of the first electrode and the second electrode,
wherein
the light-absorbing layer contains a perovskite compound represented by a chemical formula $ASnX_3$ (where A is a monovalent cation and X is a halogen anion);
the intermediate layer is in contact with the light-absorbing layer;
the at least one electrode selected from the group consisting of the first electrode and the second electrode has light-transmissive property; and
the intermediate layer contains at least one selected from the group consisting of (4-(1',5'-dihydro-1'-methyl-2'H-[5,6]fullereno-C60Ih[1,9-c]pyrrol-2'-yl)benzoic acid) and fullerene C60.

The present disclosure provides a tin perovskite solar cell in which the open voltage thereof is further improved.

DETAILED DESCRIPTION OF THE EMBODIMENT

Definition of Terms

The term "perovskite compound" used in the present specification means a perovskite crystal structure represented by a chemical formula $ABX_3$ (where A is a monovalent cation, B is a divalent cation, and X is a halogen anion) and a structure having a crystal similar thereto.

The term "tin perovskite compound" used in the present specification means a perovskite compound containing tin.

The term "tin perovskite solar cell" used in the present specification means a solar cell including the tin perovskite compound as a light-absorbing material.

The term "lead perovskite compound" used in the present specification means a perovskite compound containing lead.

The term "lead perovskite solar cell" used in the present specification means a solar cell including the lead perovskite compound as a light-absorbing material.

Embodiment of Present Disclosure

Hereinafter, the embodiment of the present disclosure will be described in more detail with reference to the drawings.

Figure 3:
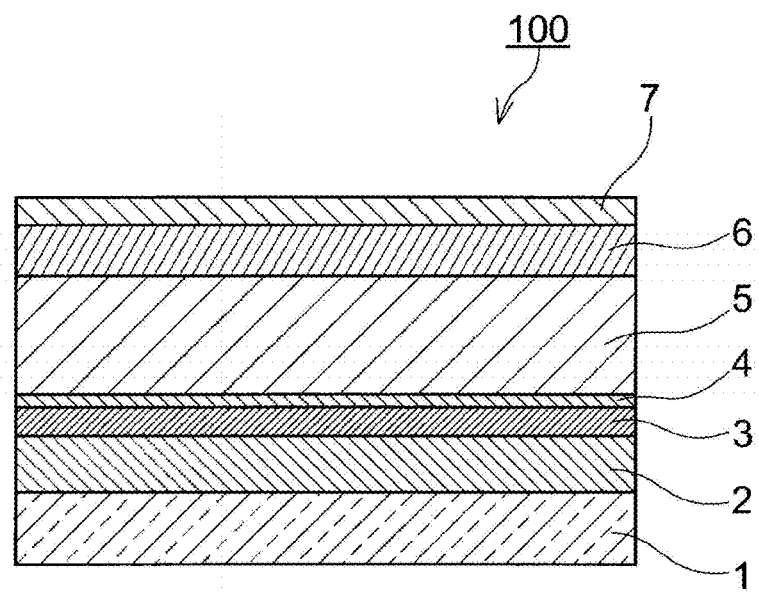
FIG. 3 shows a cross-sectional view of the solar cell according to the embodiment.

FIG. 3 shows a cross-sectional view of a solar cell 100 according to the embodiment.

As shown in FIG. 3, the solar cell 100 according to the embodiment comprises a first electrode 2, a second electrode 7, a light-absorbing layer 5, and an intermediate layer 4. The light-absorbing layer 5 is located between the first electrode 2 and the second electrode 7. The intermediate layer 4 is located between the light-absorbing layer 5 and at least one electrode selected from the group consisting of the first electrode 2 and the second electrode 7. In FIG. 3, the intermediate layer 4 is located between the light-absorbing layer 5 and first electrode 2. The intermediate layer 4 may be located between the light-absorbing layer 5 and the second electrode 7. The solar cell 100 according to the embodiment comprises two intermediate layers 4 in such a manner that one of the two intermediate layers 4 is located between the light-absorbing layer 5 and the first electrode 2 and the other of the two intermediate layers 4 is located between the light-absorbing layer 5 and the second electrode 7. The intermediate layer 4 is in direct contact (i.e. physical contact) with the light-absorbing layer 5. The first electrode 2 faces the second electrode 7 in such a manner that the intermediate layer 4 and the light-absorbing layer 5 are disposed between the first electrode 2 and the second electrode 7. The at least one electrode selected from the group consisting of the first electrode 2 and the second electrode 7 has light-transmissive property. In the present specification, the sentence "the electrode has light-transmissive property" means that 10% or more of light having a wavelength of not less than 200 nanometers and not more than 2,000 nanometers travels through the electrode at any wavelength.

The solar cell 100 according to the embodiment may further comprise an electron transport layer 3 located between the light-absorbing layer 5 and the first electrode 2. In this case, the intermediate layer 4 may be located between the light-absorbing layer 5 and the electron transport layer 3.

The solar cell 100 according to the embodiment may further comprise an hole transport layer 6 located between the light-absorbing layer 5 and the second electrode 7. In this case, the intermediate layer 4 may be located between the light-absorbing layer 5 and the hole transport layer 6. The solar cell 100 according to the embodiment may further comprise a substrate 1. The first electrode 2 is provided on the substrate 1.

(Light-Absorbing Layer 5)

The light-absorbing layer 5 contains a perovskite compound represented by a chemical formula $ASnX_3$ (where A is a monovalent cation and X is a halogen anion) as the light-absorbing material. The monovalent cation located at the A site is not limited. An example of the monovalent cation is an organic cation or an alkali metal cation. An example of the organic cation is a methylammonium cation (i.e., $CH_3NH_3^+$), a formamidinium cation (i.e., $NH_2CHNH_2^+$), a phenethylammonium cation (i.e., $C_6H_5CH_2CH_2NH_3^+$), or a guanidinium cation (i.e., $CH_6N_3^+$). An example of the alkali metal cation is a cesium cation (i.e., $Cs^+$). It is desirable that the monovalent cation located at the A site is a formamidinium cation. The monovalent cation located at the A site may be composed of two or more kinds of the cations. An example of the halogen anion located at the X site is an iodide ion. The halogen anion located at the X site may be composed of two or more kinds of the halogen ions.

The light-absorbing layer 5 may contain a material other than the light-absorbing material. For example, the light-absorbing layer 5 may further contain a quencher material to lower a defect density of the perovskite compound represented by the chemical formula $ASnX_3$. The quencher material is a fluorine compound such as tin fluoride. A molar ratio of the quencher material to the light-absorbing material may be not less than 5% and not more than 20%.

The light-absorbing layer 5 contains the perovskite compound represented by the chemical formula $ASnX_3$, as described above. The light-absorbing layer 5 may mainly contain the perovskite compound represented by the chemical formula $ASnX_3$. The sentence "the light-absorbing layer 5 mainly contains the perovskite compound represented by the chemical formula $ASnX_3$" means that the light-absorbing layer 5 contains 70 mass percent or more of the perovskite compound represented by the chemical formula $ASnX_3$. The light-absorbing layer 5 may contain 80 mass percent or more of the perovskite compound represented by the chemical formula $ASnX_3$. The light-absorbing layer 5 may further contain a compound other than the perovskite compound represented by the chemical formula $ASnX_3$. The light-absorbing layer 5 may contain impurities.

The light-absorbing layer 5 has a thickness of, for example, not less than 100 nanometers and not more than 10 micrometers. The light-absorbing layer 5 may have a thickness of not less than 100 nanometers and not more than 1,000 nanometers. The thickness of the light-absorbing layer 5 may depend on the magnitude of the light-absorbing of the light-absorbing layer 5. The light-absorbing layer 5 may be formed by an application method using a solution.

(Intermediate Layer 4)

The intermediate layer 4 contains at least one selected from the group consisting of fullerene and the derivative thereof. The fullerene is a fullerene C60 (namely, Buckminsterfullerene). The derivative of fullerene is 4-(1',5'-dihydro-1'-methyl-2'H-[5,6]fullereno-C60Ih[1,9-c]pyrrol-2'-yl) benzoic acid (hereinafter, referred to as "C60-SAM"). The intermediate layer 4 may have a mass spectrum having a first peak located at the mass number of 720.

C60-SAM has a larger voltage improvement effect than [6,6]-phenyl-C61-butyric acid methyl (hereinafter, referred to as "PCBM"), since a SAM part adsorbs chemically on an oxide surface which is the electron transport layer to raise an in-plane coverage factor of C60. On the other hand, PCBM does not adsorb chemically on an oxide surface. PCBM is dissolved to disappear upon an application of the perovskite solution. As a result, the coverage factor is low and the effect is lowered.

The intermediate layer 4 may contain tin elements.

In the intermediate layer 4, a molar ratio of carbon to tin, (namely, which is equal to a value of (the number of moles of carbon atoms)/(the number of moles of tin atoms)), may be not less than 35% and not more than 408%, or not less than 51% and not more than 110%. The molar ratio is calculated from a measurement result by an X-ray photoelectron spectroscopy method.

If the intermediate layer 4 contains C60-SAM, the molar ratio of carbon to tin may be not less than 51% and not more than 263%, or not less than 51% and not more than 109%.

If the intermediate layer 4 contains fullerene C60, the molar ratio of carbon to tin may be not less than 74% and not more than 408%, or not less than 74% and not more than 212%.

The molar ratio of carbon to tin falls within the above range to achieve high open voltage.

The molar ratio of carbon to tin in the intermediate layer 4 is a molar ratio calculated from the measurement result at one point, in a case where the measurement by an X-ray photoelectron spectroscopy method is allowed to be performed only at the one point due to the relation between the measurement limit of the measurement device and the thickness of the intermediate layer 4. In the region determined to be a region of the intermediate layer 4, in a case where the measurement by the X-ray photoelectron spectroscopy method is allowed to be performed at a plurality of points, the molar ratio of carbon to tin in the intermediate layer 4 is a mean value of molar ratios calculated from the plurality of the measurement results.

The intermediate layer 4 has a thickness of, for example, not less than 0.7 nanometers and not more than 10 nanometers. In the present embodiment, the region of the intermediate layer 4 in the solar cell is determined below. While the solar cell is etched along the thickness direction thereof from a principal surface of the solar cell, elemental composition of the surface exposed by the etching is measured by the X-ray spectroscopy measurement. The region where a molar quantity of the perovskite compound contained in the light-absorbing layer 5 is substantially equal to a molar quantity of the material which constitutes a layer adjacent to the light-absorbing layer 5 through the intermediate layer 4 is determined to be the region of the intermediate layer 4. The molar quantity is provided on the basis of the X-ray spectroscopy measurement. The molar quantity of the perovskite compound contained in the light-absorbing layer 5 is provided, for example, using the number of moles of the tin element measured by the X-ray spectroscopy measurement. The molar quantity of the material which constitutes a layer adjacent to the light-absorbing layer 5 through the intermediate layer 4 is also provided using the number of moles, which is measured by the X-ray spectroscopy measurement, of a specific element which constitutes the adjacent layer. Hereinafter, the specific element is referred to as "first element". Since the intermediate layer 4 is determined as above, even if the intermediate layer 4 is significantly thin, the region where the intermediate layer 4 is provided is allowed to be identified. The layer adjacent to the light-absorbing layer 5 through the intermediate layer 4 may be the electron transport layer 3 or a layer other than the electron transport layer 3. The layer other than the electron transport layer 3 may be a porous layer which will be described later. For example, in a case where the light-absorbing layer 5, the intermediate layer 4, and the electron transport layer 3 are disposed in this order so at to be in contact with each other and where the electron transport layer 3 is formed of $TiO_2$, the region where tin elements and titanium elements which are selected as the first element are detected by the X-ray spectroscopy measurement at the substantially same quantity of moles is determined to be the intermediate layer 4. If an oxygen element is selected as the first element, the region where a half of the molar quantity of the oxygen element is detected at the substantially same as the molar quantity of the tin element is determined to be the intermediate layer 4. "The molar quantity is the substantially same" denotes that difference of the molar quantity (molar %) is not more than 10 molar %. The first element which is used to determine the intermediate layer 4 is determined as below among the elements which constitute the layer adjacent to the light-absorbing layer 5 through the intermediate layer 4. If the layer adjacent to the light-absorbing layer 5 through the intermediate layer 4 is formed of one kind of element, the one kind of element is determined as the first element. If the layer adjacent to the light-absorbing layer 5 through the intermediate layer 4 contains a plurality of kinds of the elements, for example, an element having the highest resolution in the X-ray spectroscopy measurement may be selected as the first element. For example, in a case where the layer adjacent to the light-absorbing layer 5 through the intermediate layer 4 is an electron transport layer 3 formed of $TiO_2$, Ti, which is a metal element, is higher in resolution than O, which is a light element. Therefore, in this case, Ti may be selected as the first element.

(Substrate 1)

The substrate 1 holds the first electrode 2, the intermediate layer 4, the light-absorbing layer 5, and the second electrode 7. The substrate 1 may be formed of a transparent material. An example of the substrate 1 is a glass substrate or a plastic substrate. An example of the plastic substrate is a plastic film. In a case where the first electrode 2 has sufficient strength, the solar cell 100 does not have to have the substrate 1, since the first electrode 2 holds the intermediate layer 4, the light-absorbing layer 5, and the second electrode 7.

(First Electrode 2 and Second Electrode 7)

The first electrode 2 and the second electrode 7 have electric conductivity. At least one of the first electrode 2 and the second electrode 7 has light-transmissive property. Light from a visible region to a near-infrared light region can travel through the electrode having light-transmissive property. The electrode having light-transmissive property may be formed of a material which is transparent and has electric conductivity.

An example of such a material is:

(i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one selected from the group consisting of boron, aluminum, gallium, and indium; or (vii) the composite thereof.

The electrode having light-transmissive property may be formed by providing a pattern through which light passes using a non-transparent material. An example of the pattern through which the light passes is a line, a wave, a grid, or a punching metal pattern on which a lot of fine through holes are arranged regularly or irregularly. When the electrode having light-transmissive property has the above-mentioned pattern, light can travel through a part in which an electrode material is absent. An example of the non-transparent material is platinum, gold, silver, copper, aluminum, rhodium, indium, titanium, iron, nickel, tin, zinc, or alloy containing at least two selected therefrom. An electrically-conductive carbon material may be used as the non-transparent material.

In a case where the solar cell 100 does not comprise the electron transport layer 3, the first electrode 2 may be formed of a material having a hole block property that the holes migrating from the light-absorbing layer 5 are blocked. In this case, the first electrode 2 is not in ohmic contact with the light-absorbing layer 5. The hole block property that the holes migrating from the light-absorbing layer 5 are blocked means that only the electrons generated in the light-absorbing layer 5 are allowed to be passed; however, the holes are not allowed to be passed. The Fermi energy level of the material having the hole block property is higher than the energy level of the upper end of the valence band of the light-absorbing layer 5. The Fermi energy level of the material having the hole block property may be higher than the Fermi energy level of the light-absorbing layer 5. An example of the material having the hole block property is aluminum. If the solar cell 100 comprises the electron transport layer 3 between the light-absorbing layer 5 and the first electrode 2, the first electrode 2 does not have to have the hole block property that the holes migrating from the light-absorbing layer 5 are blocked. In this case, the first electrode 2 may be in ohmic contact with the light-absorbing layer 5.

In a case where the solar cell 100 does not comprise the hole transport layer 6, the second electrode 7 is formed of a material having an electron block property that the electrons migrating from the light-absorbing layer 5 are blocked. In this case, the second electrode 7 is not in ohmic contact with the light-absorbing layer 5. The electron block property that the electrons migrating from the light-absorbing layer 5 are blocked means that only the holes generated in the light-absorbing layer 5 are allowed to be passed; however, the electron are not allowed to be passed. The Fermi energy level of the material having the electron block property is lower than the energy level of the lower end of the conduction band of the light-absorbing layer 5. The Fermi energy level of the material having the electron block property may be lower than the Fermi energy level of the light-absorbing layer 5. An example of the material having the electron block property is platinum, gold, or a carbon material such as graphene. If the solar cell 100 comprises the hole transport layer 6 between the light-absorbing layer 5 and the second electrode 7, the second electrode 7 does not have to have the electron block property that the electrons migrating from the light-absorbing layer 5 are blocked. In this case, the second electrode 7 may be in ohmic contact with the light-absorbing layer 5.

Some of materials having hole block property that the holes migrating from the light-absorbing layer 5 are blocked do not have the light-transmissive property. Some of materials having electron block property that the electrons migrating from the light-absorbing layer 5 are blocked also do not have the light-transmissive property. For this reason, if the first electrode 2 or the second electrode 7 is formed of such materials, the first electrode 2 or the second electrode 7 has the above-mentioned pattern such that light travels through the first electrode 2 or the second electrode 7.

Each of the transmissivity of the light of the first electrode 2 and the second electrode 7 may be not less than 50%, or not less than 80%. The wavelength of the light which travels through the electrode depends on an absorption wavelength of the light-absorbing layer 5. Each of the first electrode 2 and the second electrode 7 has a thickness of, for example, not less than 1 nanometer and not more than 1,000 nanometers.

(Electron Transport Layer 3)

The electron transport layer 3 includes a semiconductor. The electron transport layer 3 may be formed of a semiconductor having a bandgap of not less than 3.0 eV. If the electron transport layer 3 is formed of the semiconductor having a bandgap of not less than 3.0 eV, visible light and infrared light reaches the light-absorbing layer 5. An example of the semiconductor is an organic or inorganic n-type semiconductor.

An example of the organic n-type semiconductor is an imide compound, a quinone compound, fullerene, or a derivative of fullerene. An example of the inorganic n-type semiconductor is a metal oxide, a metal nitride, or a perovskite oxide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the metal nitride is GaN. An example of the perovskite oxide is $SrTiO_3$ or $CaTiO_3$.

The electron transport layer 3 may be formed of a material having a bandgap of more than 6.0 eV. An example of the material having a bandgap of more than 6.0 eV is (i) a halide of an alkali metal or alkali earth metal such as lithium fluoride or calcium fluoride, (ii) an alkali metal oxide such as magnesium oxide, or (iii) silicon dioxide. In this case, the electron transport layer 3 may have a thickness of, for example, not more than 10 nanometers to ensure the electron transport property of the electron transport layer 3.

The electron transport layer 3 may include a plurality of layers formed of materials which are different from each other.

(Hole Transport Layer 6)

The hole transport layer 6 is composed of an organic substance or an inorganic semiconductor. An example of a general organic substance used for the hole transport layer 6 is 2,2',7,7'-tetrakis-(N,N-di-p-methoxyphenylamine)9,9'-spirobifluorene (hereinafter, referred to as "spiro-OMeTAD", poly[bis(4-phenyl)(2,4,6-trimethylphenyl) amine] (hereinafter, referred to as "PTAA"), poly(3-hexylthiophene-2,5-diyl) (hereinafter, referred to as "P3HT"), poly(3,4-ethylenedioxythiophene) (hereinafter, referred to as "PEDOT"), or copper phthalocyanine (hereinafter, referred to as "CuPC").

An example of the inorganic semiconductor is $Cu_2O$, $CuGaO_2$, CuSCN, CuI, $NiO_x$, $MoO_x$, $V_2O_5$, or a carbon material such as a graphene oxide.

The hole transport layer 6 may include a plurality of layers formed of materials which are different from each other.

The hole transport layer 6 may have a thickness of not less than 1 nanometer and not more than 1,000 nanometers, not less than 10 nanometers and not more than 500 nanometers, or not less than 10 nanometers and not more than 50 nanometers. If the hole transport layer 6 has a thickness of not less than 1 nanometer and not more than 1,000 nanometers, a sufficient hole transport property is achieved. Furthermore, if the hole transport layer 6 has a thickness of not less than 1 nanometer and not more than 1,000 nanometers, light is converted into electric power with high efficiency, since the hole transport layer 6 has low resistance.

The hole transport layer 6 may contain a supporting electrolyte and a solvent. The supporting electrolyte and the solvent stabilize the holes included in the hole transport layer 6.

An example of the supporting electrolyte is an ammonium salt or an alkali metal salt. An example of the ammonium salt is tetrabutylammonium perchlorate, tetraethylammonium hexafluorophosphate, an imidazolium salt, or a pyridinium salt. An example of the alkali metal salt is lithium bis(trifluoromethanesulfonyl)imide (hereinafter, referred to as "LiTFSI"), $LiPF_6$, $LiBF_4$, lithium perchlorate, or potassium tetrafluoroborate.

The solvent contained in the hole transport layer 6 may have high ionic conductivity. The solvent may be an aqueous solvent or an organic solvent. It is desirable that the solvent is an organic solvent, in light of stabilization of the solute. An example of the organic solvent is tert-butyl pyridine, pyridine, or a heterocyclic compound such as n-methylpyrrolidone.

The solvent contained in the hole transport layer 6 may be an ionic liquid. The ionic liquid may be used solely or in combination of another solvent. The ionic liquid is desirable in light of low volatility and high flame resistance.

An example of the ionic liquid is an imidazolium compound such as 1-ethyl-3-methylimidazolium tetracyanoborate, a pyridine compound, an alicyclic amine compound, an aliphatic amine compound, or an azonium amine compound.

(Function Effect of Solar Cell)

The fundamental function effect of the solar cell 100 will be described. When the solar cell 100 is irradiated with light, the light-absorbing layer 5 absorbs the light to generate excited electrons and holes. The excited electrons migrate to the electron transport layer 3 through the intermediate layer 4. On the other hand, the holes generated in the light-absorbing layer 5 migrate to the hole transport layer 6. Since the electron transport layer 3 and the hole transport layer 6 are electrically connected with the first electrode 2 and the second electrode 7, respectively, electric current is taken out from the first electrode 2 and the second electrode 7 which serve as the anode and the cathode, respectively.

(Production Method of Solar Cell 100)

The solar cell 100 can be produced, for example, by the following method.

First, the first electrode 2 is formed on the surface of the substrate 1 by a chemical vapor deposition method (hereinafter, referred to as "CVD method") or a sputtering method. Next, the electron transport layer 3 is formed on the first electrode 2 by a sputtering method.

Next, the intermediate layer 4 is formed on the electron transport layer 3. An example of the method for forming the intermediate layer 4 is an application method and a vapor deposition method. Hereinafter, the application method will be described. First, a solution containing at least one selected from the group consisting of fullerene or the derivative thereof and an organic solvent is prepared. An example of the organic solvent is chlorobenzene, toluene, dimethylsulfoxide (hereinafter, referred to as "DMSO"), or N, N-dimethylformamide (hereinafter, referred to as "DMF"). The at least one selected from the group consisting of fullerene or the derivative thereof may have a concentration of not less than 0.01 mg/mL and not more than 10 mg/mL, or not less than 0.1 mg/mL and not more than 5 mg/mL. The solution is applied by a spin-coat method on the electron transport layer 3. Then, the applied solution is heated at temperature of, for example, not less than 80 degrees Celsius and not more than 160 degrees Celsius. In this way, the intermediate layer 4 is provided.

Next, light-absorbing layer 5 is formed on the intermediate layer 4. The light-absorbing layer 5 may be formed by the following method. As one example, a formation method of the light-absorbing layer 5 containing the perovskite compound represented by the chemical formula $(HC(NH_2)_2)_{1-y}(C_6H_5CH_2CH_2NH_3)_ySnI_3$ (where $0<y<1$, hereinafter, referred to as "$FA_{1-y}PEA_ySnI_3$") will be described.

First, $SnI_2$, $HC(NH_2)_2I$ (hereinafter, referred to as "FAI"), and $C_6H_5CH_2CH_2NH_3I$ (hereinafter, referred to as "PEAI") are added to an organic solvent to provide a liquid mixture. An example of the organic solvent is a liquid mixture of DMSO and DMF (the volume ratio of DMSO:DMF=1:1).

The molar concentration of $SnI_2$ may be not less than 0.8 mol/L and not more than 2.0 mol/L, or not less than 0.8 mol/L and not more than 1.5 mol/L.

The molar concentration of FAI may be not less than 0.8 mol/L and not more than 2.0 mol/L, or not less than 0.8 mol/L and not more than 1.5 mol/L.

The molar concentration of PEAI may be not less than 0.1 mol/L and not more than 0.5 mol/L, or not less than 0.1 mol/L and not more than 0.3 mol/L.

Next, the liquid mixture is heated with the heater to temperature of not less than 40 degrees Celsius and not more than 180 degrees Celsius. In this way, a mixture solution in which $SnI_2$, FAI, and PEAI have been dissolved is provided. Subsequently, the provided mixture solution is left at rest at room temperature.

The mixture solution is applied on the electron transport layer 3 by a spin-coat method to form an application film. Then, the application film is heated at temperature of not less than 40 degrees Celsius and not more than 100 degrees Celsius for not less than 15 minutes and not more than 1 hour. In this way, the light-absorbing layer 5 is formed. In a case where the mixture solution is applied by a spin-coat method, droplets of a poor solvent may be put during the spin-coat. An example of the poor solvent is toluene, chlorobenzene, or diethyl ether.

The mixture solution may contain a quencher material such as tin fluoride. The quencher material may have a concentration of not less than 0.05 mol/L and not more than 0.4 mol/L. The quencher material prevents defects from being generated in the light-absorbing layer 5. The reason why the defect is generated in the light-absorbing layer 5 is, for example, the increase in Sn vacancies due to the increase in the amount of $Sn^{4+}$.

The hole transport layer 6 is formed on the light-absorbing layer 5. An example of the formation method of the hole transport layer 6 is an application method or a printing method. An example of the application method is a doctor blade method, a bar coating method, a spray method, a dip coating method, or a spin-coat method. An example of the printing method is a screen printing method. A plurality of the materials may be mixed to provide the hole transport layer 6, and then, the hole transport layer 6 may be pressurized or sintered. In a case where the hole transport layer 6 is formed of an organic low molecular material or an inorganic semiconductor, the hole transport layer 6 may be formed by a vacuum deposition method.

Finally, the second electrode 7 is formed on the hole transport layer 6. In this way, the solar cell 100 is provided. The second electrode 7 may be formed by a CVD method or by a sputtering method.

Figure 4:
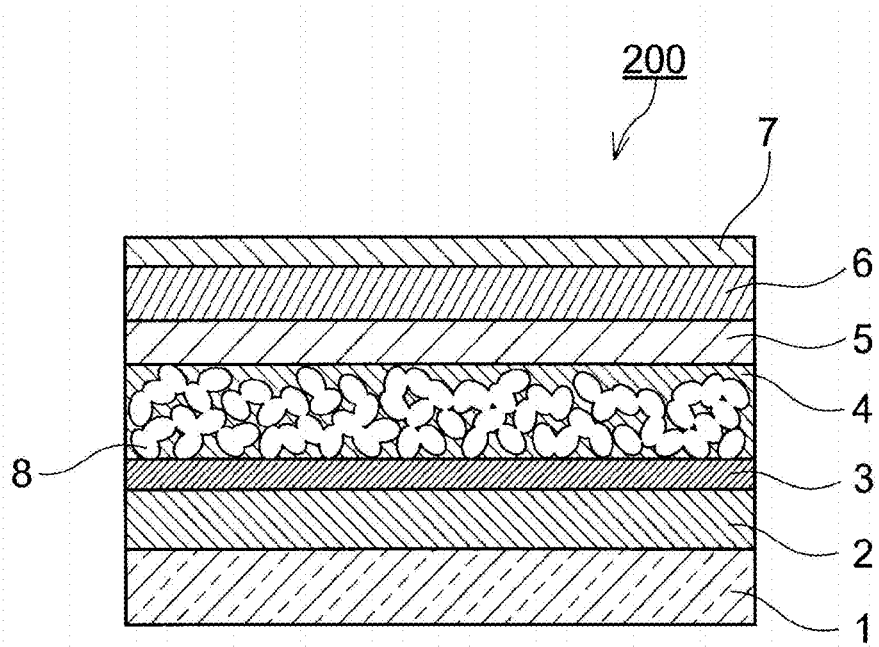
FIG. 4 shows a cross-sectional view of a variation of the solar cell according to the embodiment.

FIG. 4 shows a cross-sectional view of a variation of the solar cell 200 according to the embodiment. Unlike the solar cell 100 shown in FIG. 3, the solar cell 200 comprises a porous layer 8.

In the solar cell 200 shown in FIG. 4, the first electrode 2, the electron transport layer 3, the porous layer 8, the intermediate layer 4, the light-absorbing layer 5, the hole transport layer 6, and the second electrode 7 are stacked in this order on the substrate 1. The porous layer 8 includes a porous material. The porous material includes a pore. The solar cell 200 does not have to have the substrate 1. The solar cell 200 does not have to have the hole transport layer 6.

(Porous Layer 8)

The pore included in the porous layer 8 communicates from a part in contact with the intermediate layer 4 to a part in contact with the electron transport layer 3. The pore included in the porous layer 8 may be filled with the material of the intermediate layer 4. Furthermore, the material of the intermediate layer 4 may reach the surface of the electron transport layer 3 through the pore included in the porous layer 8. The material of the light-absorbing layer 5 is disposed on the porous layer 8 and in the pore of the porous layer 8 through the intermediate layer 4. In other words, the porous layer 8, the intermediate layer 4, and the light-absorbing layer 5 are stacked in this order. Therefore, electrons are allowed to migrate from the light-absorbing layer 5 to the electron transport layer 3 through the intermediate layer 4, although the light-absorbing layer 5 is not in direct contact with the electron transport layer 3.

The porous layer 8 facilitates the formation of the light-absorbing layer 5. The intermediate layer 4 formed on the porous layer 8 may cover, for example, a surface and a pore wall of the porous layer 8. Since the intermediate layer 4 has a small thickness, shapes of the surface and the pore of the porous layer 8 are maintained. In this case, the material of the light-absorbing layer 5 enters the inside of the pore of the porous layer 8 covered with the intermediate layer 4. For this reason, the possibility that the material of the light-absorbing layer 5 is repelled or aggregated on the surface of the intermediate layer 4 is lowered. The porous layer 8 is a foothold of the light-absorbing layer 5. The porous layer 8 allows the light-absorbing layer 5 to be formed as a uniform film. The light-absorbing layer 5 may be formed by applying a solution on the intermediate layer 4 by a spin-coat method, and then, heating.

The porous layer 8 causes light scattering. For this reason, length of a path of light which travels through the light-absorbing layer 5 may be increased. The increase in length of the path of light may increase amounts of the electrons and holes which are generated in the light-absorbing layer 5.

The solar cell 200 may be produced by a method similar to that of the solar cell 100. The porous layer 8 is formed on the electron transport layer 3, for example, by an application method.

The porous layer 8 is a foothold for the formation of the light-absorbing layer 5. The porous layer 8 does not prevent the light-absorbing layer 5 from absorbing light. The porous layer 8 also does not prevent the electrons from migrating from the light-absorbing layer 5 to the electron transport layer 3 through the intermediate layer 4.

As described above, the porous layer 8 contains the porous material. An example of the porous material is a porous material in which insulative or semiconductor particles are connected. An example of the material of the insulative particles is aluminum oxide or silicon oxide. An example of the material of the semiconductor particles is an inorganic semiconductor. The example of the inorganic semiconductor is a metal oxide (including a perovskite oxide), a metal sulfide, or a metal chalcogenide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the perovskite oxide is $SrTiO_3$ or $CaTiO_3$. An example of the metal sulfide is CdS, ZnS, $In_2S_3$, SnS, PbS, $Mo_2S$, $WS_2$, $Sb_2S_3$, $Bi_2S_3$, $ZnCdS_2$, or $Cu_2S$. An example of the metal chalcogenide (i.e. metal selenide) is CdSe, CsSe, $In_2Se_3$, $WSe_2$, HgSe, SnSe, PbSe, or CdTe.

The porous layer 8 may have a thickness of not less than 0.01 micrometer and not more than 10 micrometers, or not less than 0.1 micrometer and not more than 1 micrometer. The porous layer 8 may have a large surface roughness. In particular, a surface roughness coefficient defined by a value of an effective area/a projected area may be not less than 10, or not less than 100. The projected area is an area of a shadow of an object formed posteriorly to the object when light travelling from the front of the object is incident on the object. The effective area is an actual area of a surface of the object. The effective area can be calculated from a volume calculated from the projected area and the thickness of the object, a specific surface area of the material which constitutes the object, and a bulk density of the object. The specific surface area is measured, for example, by a nitrogen adsorption method.

Next, the fundamental functional effect of the solar cell 200 will be described. When the solar cell 200 is irradiated with light, the light-absorbing layer 5 absorbs the light to generate the excited electrons and holes. The excited electrons migrate to the electron transport layer 3 through the intermediate layer 4. On the other hand, the holes generated in the light-absorbing layer 5 migrate to the hole transport layer 6. As described above, the electron transport layer 3 and the hole transport layer 6 are electrically connected to the first electrode 2 and the second electrode 7, respectively. Hence, electric current is taken out from the first electrode 2 and the second electrode 7 which serve as the anode and the cathode, respectively.

(Findings which Established the Foundation of the Present Disclosure)

The findings which established the foundation of the present disclosure will be described below.

Figure 1:
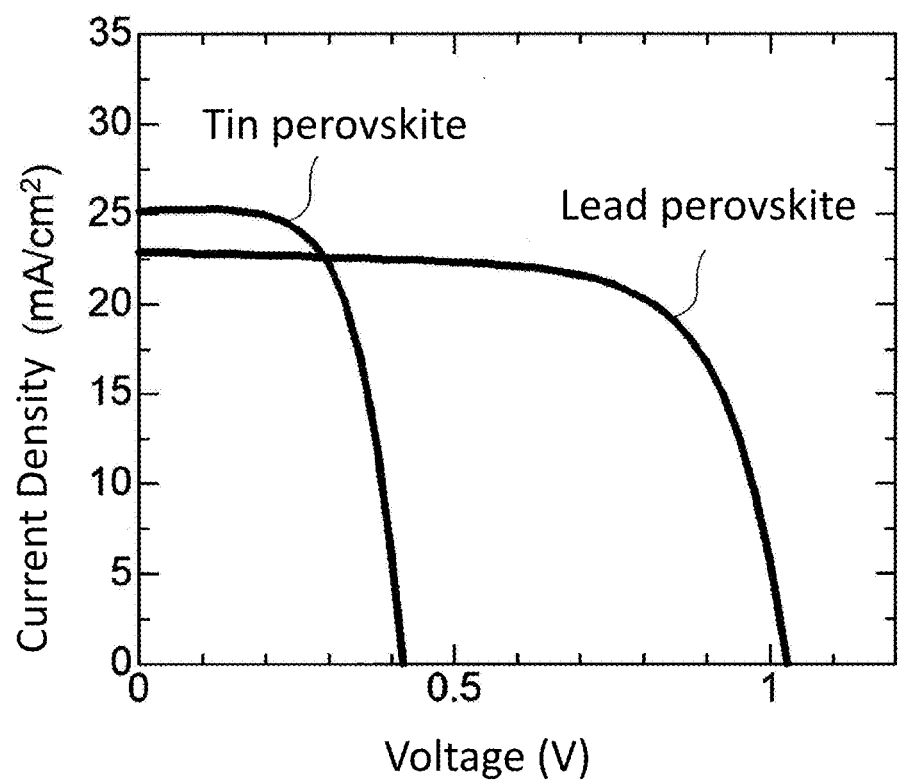
FIG. 1 is a graph showing actual measurement values of conversion efficiency of a lead perovskite solar cell and a tin perovskite solar cell produced by the present inventors.

Although the tin perovskite solar cell has high theoretical conversion efficiency, the tin perovskite solar cell has lower actual conversion efficiency than the lead perovskite solar cell. FIG. 1 is a graph showing actual measurement values of conversion efficiency of a lead perovskite solar cell and a tin perovskite solar cell produced by the present inventors. Each of the lead perovskite solar cell and the tin perovskite solar cell had a stacking structure of the substrate/the first electrode/the electron transport layer/the porous layer/the light-absorbing layer/the hole transport layer/the second electrode. The details of the lead perovskite solar cell and the tin perovskite solar cell will be described.

(Lead Perovskite Solar Cell)
Substrate: Glass substrate
First electrode: Mixture of indium-tin composite oxide (hereinafter, referred to as "ITO") and a tin oxide doped with antimony (hereinafter, referred to as "ATO")
Electron transport layer: Dense $TiO_2$ (namely, c-$TiO_2$)
Porous layer: Mesoporous $TiO_2$ (namely, mp-$TiO_2$)
Light-absorbing layer: $HC(NH_2)_2PbI_3$
Hole transport layer: spiro-OMeTAD(2,2',7,7'-tetrakis-(N,N-di-p-methoxyphenylamine)9,9'-spirobifluorene)
Second electrode: Gold
(Tin Perovskite Solar Cell)
Substrate: Glass substrate
First electrode: Mixture of indium-tin composite oxide (namely, ITO) and the tin oxide doped with antimony (namely, ATO)
Electron transport layer: Dense $TiO_2$ (namely, c-$TiO_2$)
Porous layer: Mesoporous $TiO_2$ (namely, mp-$TiO_2$)
Light-absorbing layer: $HC(NH_2)_2SnI_3$
Hole transport layer: PTAA (namely, poly[bis(4-phenyl) (2,4,6-trimethylphenyl)amine])
Second electrode: Gold FIG. 1 reveals that the tin perovskite solar cell has lower open voltage than the lead perovskite solar cell. This would be a reason why the tin perovskite solar cell has lower conversion efficiency than the lead perovskite solar cell. The reason why the open voltage is low would be that a large defect level of the tin perovskite compound is present at an interface between the electron transport layer and the tin perovskite compound and that carriers are recombined at the level.

Unlike the lead perovskite solar cell, the tin perovskite solar cell has a lot of defects at the interface between the electron transport layer and the light-absorbing layer. The reason therefor is that Sn vacancies are easily generated in the tin perovskite compound and that the tin perovskite compound has more defects than the lead perovskite compound. If the defect is generated at the interface between the electron transport layer and the light-absorbing layer, the large recombination level is generated at the interface between the electron transport layer and the light-absorbing layer due to a strong interaction between the electron transport material and the tin perovskite compound.

Figure 2A:
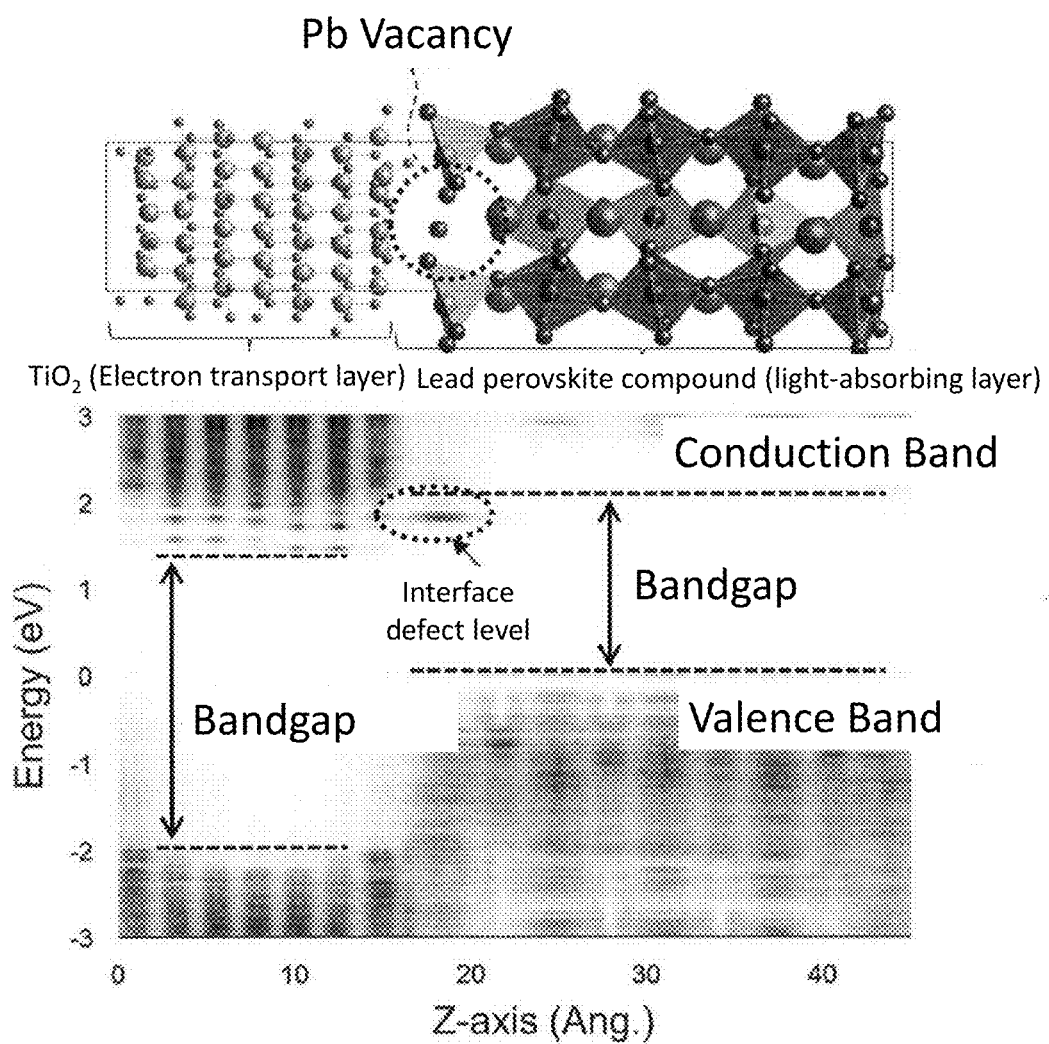
FIG. 2A shows a calculation result of a density of electronic states by a first principle calculation method in a case where an electron transport layer is formed of $TiO_2$, where a light-absorbing layer is formed of $CsPbI_3$, which is a lead perovskite compound, and where a Pb vacancy is introduced into the $CsPbI_3$ at an interface between the electron transport layer and the light-absorbing layer.

FIG. 2A shows a calculation result of a density of electronic states by a first principle calculation method in a case where an electron transport layer is formed of $TiO_2$, where a light-absorbing layer is formed of $CsPbI_3$, which is a lead perovskite compound, and where a Pb vacancy is introduced into the $CsPbI_3$ at an interface between the electron transport layer and the light-absorbing layer.

Figure 2B:
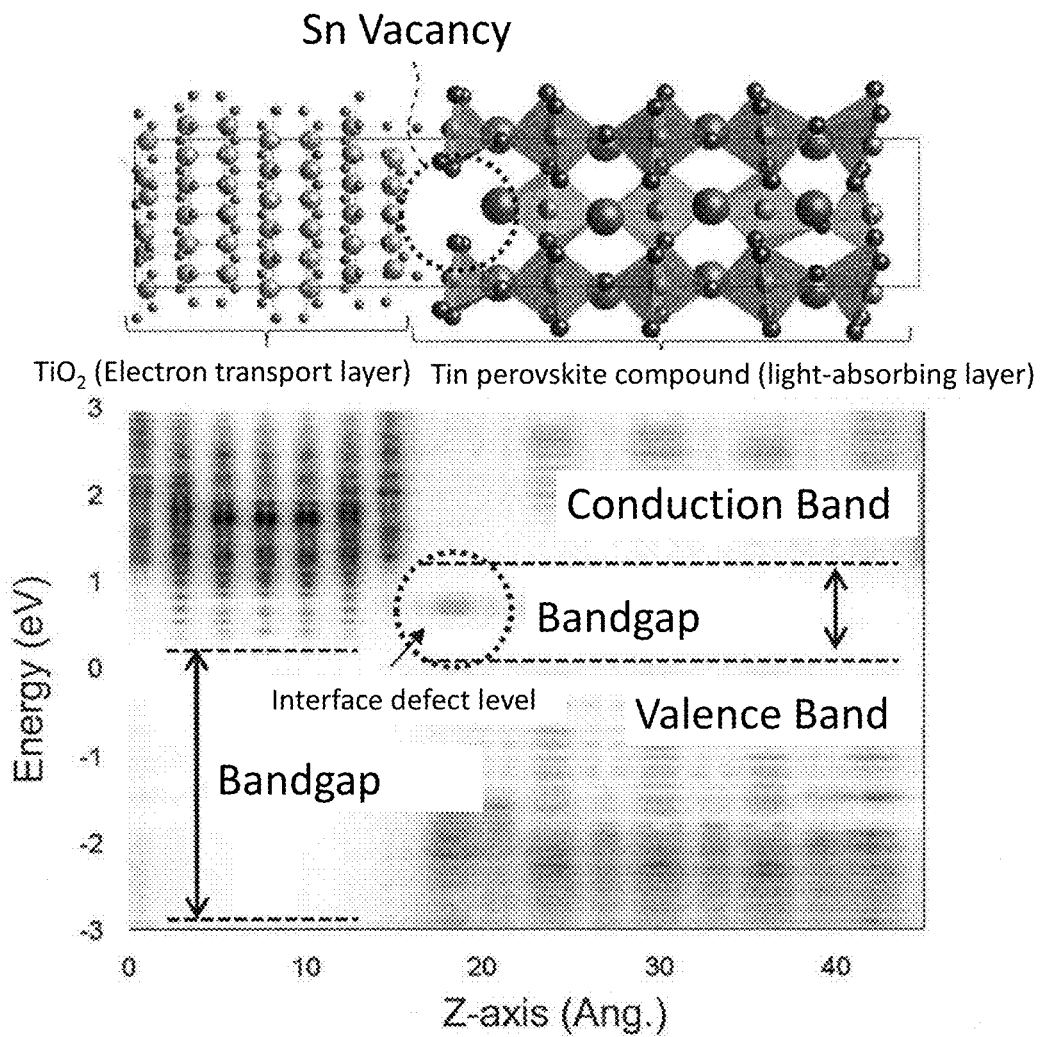
FIG. 2B shows a calculation result of a density of electronic states by a first principle calculation method in a case where an electron transport layer is formed of $TiO_2$, where a light-absorbing layer is formed of $CsSnI_3$, which is a tin perovskite compound, and where an Sn vacancy is introduced into the $CsSnI_3$ at an interface between the electron transport layer and the light-absorbing layer.

FIG. 2B shows a calculation result of a density of electronic states by a first principle calculation method in a case where an electron transport layer is formed of $TiO_2$, where a light-absorbing layer is formed of $CsSnI_3$, which is a tin perovskite compound, and where a Sn vacancy is introduced into the $CsSnI_3$ at an interface between the electron transport layer and the light-absorbing layer.

In FIG. 2A and FIG. 2B, the energy level of the upper end of the valence band of the perovskite compound is 0 eV. The energy levels of the lower end of the conduction band of the perovskite compound, the upper end of the valence band of $TiO_2$, and the lower end of the conduction band of $TiO_2$ are indicated as relative values with regard to the energy level of the upper end of the valence band of the perovskite compound.

FIG. 2B suggests that the large defect level is formed at the center of the upper end of the valence band and the lower end of the conduction band of the tin perovskite compound, due to the Sn vacancies generated at the interface between the electron transport layer and the light-absorbing layer.

In particular, iodide atoms redundant due to generation of the Sn vacancies are strongly bound to titanium atoms. As a result, the iodide atoms are stabilized. This would change the 3d orbital of the titanium atom (i.e., Ti-3d orbital) forming the conduction band at the interface between the electron transport layer and the light-absorbing layer.

As a result, the large defect level would be formed due to the energy level of the changed Ti-3d orbital at the center of the upper end of the valence band and the lower end of the conduction band of the tin perovskite compound.

On the other hand, in FIG. 2A, the lead perovskite compound has weaker electronic interaction with the electron transport material than the tin perovskite compound. For this reason, the defect level formed due to the Pb vacancies is small and located at the higher position than the center of the upper end of the valence band and the lower end of the conduction band.

As seen in the tin perovskite compound, the large defect level may raise a problem of deactivation of the carriers due to relaxation of the electrons in the conduction band and the holes in the valence band to the defect level. On the other hand, as seen in the lead perovskite compound, the possibility of relaxation of the electrons and the holes is relatively low, when the small defect level is generated.

Therefore, the presence of the defect level is less likely to contribute the deactivation of the carriers. Hence, the interface defect is a problem unique to the tin perovskite compound.

As above, the defect level of the tin perovskite compound at the interface is made smaller to improve the open voltage of the tin perovskite solar cell.

The present inventors found that fullerene or the derivative thereof is introduced between the electron transport layer and the light-absorbing layer to prevent the large defect level from being generated. In more detail, the present inventors found that fullerene or the derivative thereof has relatively weak interaction with the tin perovskite compound and that fullerene or the derivative thereof is less likely to generate the large defect level in the tin perovskite compound, even when the fullerene or the derivative thereof is in contact with the tin perovskite compound.

EXAMPLES

The present disclosure will be described in more detail with reference to the following examples.

Inventive Example 1

In the inventive example 1, the solar cell 100 shown in FIG. 3 was produced as below.

A glass substrate having a $SnO_2$ layer doped with indium on the surface thereof was prepared. The glass substrate was a product of Nippon Sheet Glass Company, Co., Ltd. The glass substrate and the $SnO_2$ layer served as the substrate 1 and the first electrode 2, respectively. The glass substrate had a thickness of 1 millimeter.

A titanium oxide layer having a thickness of approximately 10 nanometers was formed as the electron transport layer 3 on the first electrode 2 by a sputtering method.

A droplet of a chlorobenzene solution (200 milliliters) having a C60-SAM concentration of 0.1 mg/mL was put on the electron transport layer 3. Then, the solution was spread by a spin-coat method on the electron transport layer 3. The solution was sintered on a hot plate maintained at 120 degrees Celsius. In this way, the intermediate layer 4 was formed.

Next, $SnI_2$, $SnF_2$, FAI (i.e., $HC(NH_2)_2I$), and PEAI (i.e., $C_6H_5CH_2CH_2NH_3I$) were added to a mixture solvent of DMSO and DMF to provide a mixture solution. A volume ratio of DMSO:DMF in the mixture solvent was 1:1. The concentrations of $SnI_2$, $SnF_2$, FAI, and PEAI were 1.5 mol/L, 0.15 mol/L, 1.5 mol/L, and 0.3 mol/L, respectively.

In a glove box, the mixture solution (80 microliters) was applied on the intermediate layer 4 by a spin-coat method to provide an application film. The inside of the glove box was filled with $N_2$ and had an oxygen concentration of not more than 0.1 ppm.

Then, the application film was sintered on the hot plate at 80 degrees Celsius. In this way, the light-absorbing layer 5 was formed. The light-absorbing layer 5 contained the perovskite compound of the chemical formula $FA_{0.83}PEA_{0.17}SnI_3$ mainly.

Next, in the glove box, a toluene solution (80 microliters) containing PTAA (i.e., poly[bis(4-phenyl)(2,4,6-trimethylphenyl)amine]) at a concentration of 10 milligrams/milliliter was applied on the light-absorbing layer 5 by a spin-coat method to form the hole transport layer 6.

Finally, a gold film having a thickness of 100 nanometers was deposited on the hole transport layer 6 to form the second electrode 7. In this way, the tin perovskite solar cell according to the inventive example 1 was provided.

(Identification of Intermediate Layer 4 and Molar Ratio of Carbon to Tin in Intermediate Layer 4)

A molar ratio of carbon to tin in the intermediate layer 4 was measured with an X-ray photoelectron spectroscopy measurement device (product of ULVAC-PHI, Inc., trade name: PHI 5000 VersaProbe II). Specifically, while the solar cell according to the inventive example 1 was etched from the principal surface of the second electrode 7 along a thickness direction thereof, the elemental composition of the surface exposed by the etching was measured with the device by an X-ray spectroscopy measurement method. The etching was conducted by a sputtering method using an argon gas. A region in which titanium elements and tin elements were detected at the same molar quantity was identified as a region of the intermediate layer 4. The molar ratio of carbon to tin in the region of the thus-identified intermediate layer 4 was provided from the results of the X-ray spectroscopy measurement using the device. The measured sample was transported under an $N_2$ atmosphere without being exposed to the atmosphere.

(Analysis of Intermediate Layer 4 by TOF-SIMS Method)

The present inventors determined whether or not the region of the above-identified intermediate layer 4 contained fullerene or the derivative thereof on the basis of analysis of C60 by a time-of-flight secondary ion mass spectrometry method (hereinafter, referred to as "TOF-SIMS method") with a time-of-flight secondary ion mass spectrometer (product of ION-TOF (Germany), trade name: TOF.SIMS5-200).

The etching was conducted by a sputtering method.

A gas cluster ion beam (hereinafter, referred to as "GCIB") was used as a source of the sputtering.

The measured sample was transported under an $N_2$ atmosphere without being exposed to the atmosphere.

Figure 5:
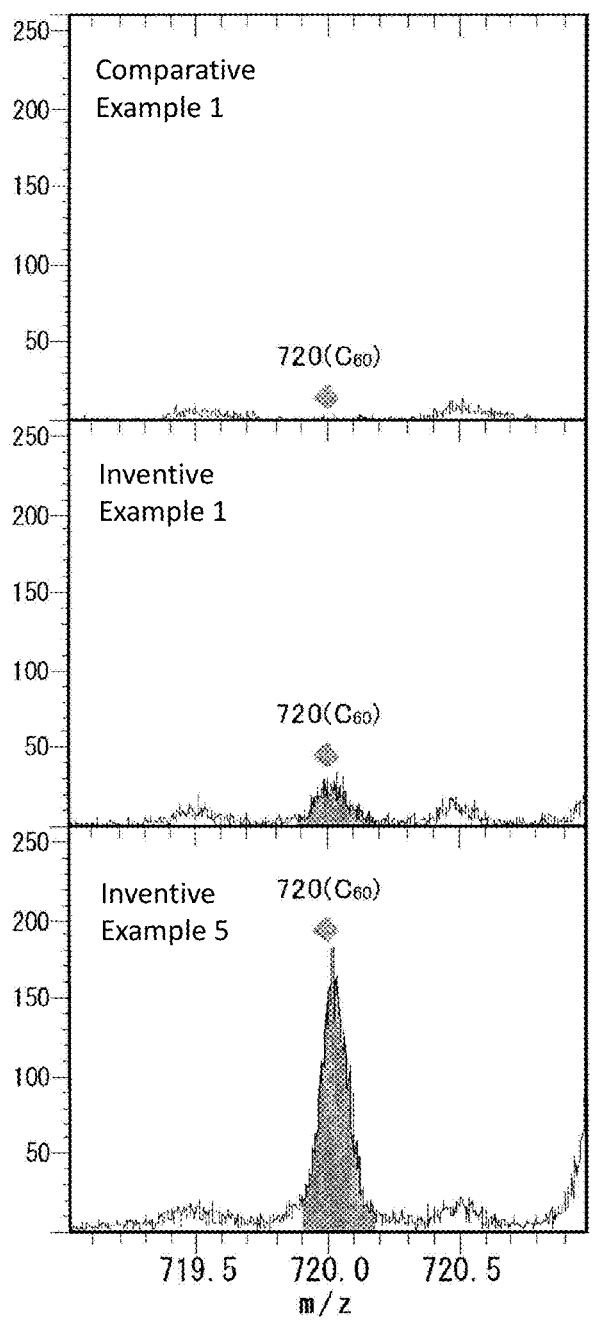
FIG. 5 shows analysis results of C60 in the solar cells according to the inventive examples and the comparative examples by a time-of-flight secondary ion mass spectrometry method (i.e., "TOF-SIMS method").

FIG. 5 shows a TOF-SIMS spectrum of anions in the inventive example 1. FIG. 5 also shows TOF-SIMS spectra of anions in the inventive example 5 and the comparative example 1, both of which will be described later.

In the mass spectrum shown in FIG. 5, the peak located at the mass number of 720 is derived from a fullerene group of C60. In the mass spectrum shown in FIG. 5, the horizontal axis represents a mass-to-charge ratio (m/z). However, in the present examples, since the charge number is 1 (z=1), the value of (m/z) represents a value of the mass number (the value of m).

(Fluorescence Lifetime)

With a near-infrared fluorescence lifetime measurement device (product of Hamamatsu Photonics K. K., trade name: C7990), fluorescence lifetime of the light-absorbing layer 5 included in the solar cell according to the inventive example 1 was measured from a photoluminescence measurement. As an excitation laser, a YAG laser of 532 nm was used. The measurement was conducted in a condition where the observation wavelength was 890 nm, the excitation output was from 0 mW to 50 mW, and the peak count was 1,000. The laser was incident along a direction toward the electron transport layer 3, and then, the fluorescence returned along the direction was measured to measure a defect density of the perovskite compound at a surface part of the light-absorbing layer 5 which faced the electron transport layer 3. A part without an effect of a superposition of a pulse of a time waveform of the laser was extracted, and then, the part was fit by a least-square method on a fluorescence decay curve $A=A_0 \exp(-t/t)$ (where A, $A_0$, and t represent a fluorescence intensity, a composition intensity, and time, respectively) to provide a fluorescence lifetime t.

The measured sample was not exposed to the atmosphere. The measured sample was transported and measured under an $N_2$ atmosphere.

(Open Voltage)

The solar cell according to the inventive example 1 was irradiated with pseudo sunlight having a luminescence intensity of 100 $mW/cm^2$ with a solar simulator to measure a current-voltage characteristic. An open voltage of the solar cell of the inventive example 1 was provided from the current-voltage characteristic after stabilization. The measurement was conducted at room temperature. The measured sample was not exposed to the atmosphere. The measured sample was transported and measured under an $N_2$ atmosphere.

Inventive Example 2

In the inventive example 2, an experiment similar to the inventive example 1 was conducted, except that the concentration of C60-SAM contained in the chlorobenzene solution was 0.5 mg/m L.

Inventive Example 3

In the inventive example 3, an experiment similar to the inventive example 1 was conducted, except that the concentration of C60-SAM contained in the chlorobenzene solution was 1.0 mg/m L.

Inventive Example 4

In the inventive example 4, an experiment similar to the inventive example 1 was conducted, except that fullerene C60 having a thickness of 1 nanometer was vapor-deposited on the electron transport layer 3 to form the intermediate layer 4 in place of applying the chlorobenzene solution containing C60-SAM by the spin-coat method.

Inventive Example 5

In the inventive example 5, an experiment similar to the inventive example 1 was conducted, except that fullerene C60 having a thickness of 5 nanometers was vapor-deposited on the electron transport layer 3 to form the intermediate layer 4 in place of applying the chlorobenzene solution containing C60-SAM by the spin-coat method.

Inventive Example 6

In the inventive example 6, an experiment similar to the inventive example 1 was conducted, except that fullerene C60 having a thickness of 10 nanometers was vapor-deposited on the electron transport layer 3 to form the intermediate layer 4 in place of applying the chlorobenzene solution containing C60-SAM by the spin-coat method.

Comparative Example 1

In the comparative example 1, an experiment similar to the inventive example 1 was conducted, except that the chlorobenzene solution containing C60-SAM was not applied by the spin-coat method (namely, the intermediate layer 4 was not formed).

Comparative Example 2

In the comparative example 2, an experiment similar to the inventive example 1 was conducted, except that an ethanol solution containing 4-fluorobenzoic acid at a concentration of 0.2 mol/L was applied by the spin-coat method to form the intermediate layer 4 in place of applying the chlorobenzene solution containing C60-SAM by the spin-coat method.

Comparative Example 3

In the comparative example 3, an experiment similar to the inventive example 1 was conducted, except that an ethanol solution containing glycine at a concentration of 0.2 mol/L was applied by the spin-coat method to form the intermediate layer 4 in place of applying the chlorobenzene solution containing C60-SAM by the spin-coat method.

The following Table 1 shows the results of the inventive examples 1-6 and the comparative examples 1-3.

TABLE 1

| | Material of Intermediate Layer 4 | Presence or Absence of Fullerene or Derivative thereof in Intermediate layer 4 by TOF-SIMS method | Molar ratio of Carbon to Tin in Intermediate layer 4 (%) | Fluorescence Lifetime (ns) | Open Voltage (mV) |
|---|---|---|---|---|---|
| Inventive Example 1 | C60-SAM | Presence | 51.7 | 13.8 | 339 |
| Inventive Example 2 | C60-SAM | Presence | 76.8 | 14.1 | 364 |
| Inventive Example 3 | C60-SAM | Presence | 108.3 | 19.5 | 346 |
| Inventive Example 4 | Fullerene 60 | Presence | 74.8 | 12.1 | 305 |
| Inventive Example 5 | Fullerene 60 | Presence | 211.7 | 11.4 | 302 |
| Inventive Example 6 | Fullerene 60 | Presence | 407.9 | 10.5 | 277 |
| Comparative Example 1 | None | Absence | 34.5 | 10.4 | 265 |
| Comparative Example 2 | 4-Fluorobenzonic acid | Absence | — | 10.3 | 248 |
| Comparative Example 3 | Glycine | Absence | — | 1.0 | 71 |

As is clear from the comparison of the inventive examples 1-6 to the comparative example 1, the intermediate layer 4 containing at least one selected from the group consisting of C60-SAM and fullerene 60 is provided to raise the open voltage of the solar cell.

As demonstrated in the inventive examples 1-3, if the intermediate layer 4 contains C60-SAM and the molar ratio of carbon to tin in the intermediate layer 4 is not less than 51% and not more than 109%, high open voltage is provided.

As is clear from the comparison of the inventive examples 1-3 to the comparative example 1, the intermediate layer 4 containing C60-SAM is provided to increase the fluorescence lifetime. This suggests that the intermediate layer 4 containing C60-SAM allows the defect level of the perovskite compound at the surface part of the light-absorbing layer 5 which faces the electron transport layer 3 to be low, and that, as a result, recombination loss is decreased.

Non-Patent Literature 2 discloses that a C60-SAM layer is provided between the light-absorbing layer and the electron transport layer in the solar cell in which the lead perovskite compound is used as the material of the light-absorbing layer. However, unlike the tin perovskite compound, in the lead perovskite compound, defects are less likely to be generated at the interface between the light-absorbing layer and the electron transport layer. Furthermore, as also described with reference to FIG. 2A and FIG. 2B, even if the defects of Pb vacancies are generated in the lead perovskite compound, the generated defect level is inherently low. Accordingly, even if the defects are generated in the perovskite compound included in the lead perovskite solar cell, the problem of voltage reduction due to the deactivation of the carriers is not raised. Accordingly, the lead perovskite solar cell does not have a problem of the voltage reduction due to the defects of the perovskite. The problem is a problem in the tin perovskite solar cell. In other words, a problem solved with C60-SAM in the lead perovskite solar cell is different from a problem of the solar cell according to the present disclosure, which is a tin perovskite solar cell.

As reported in Non-Patent Literature 2, in the lead perovskite solar cell, C60-SAM is used in the electron transport layer to lessen the energy difference between the lower ends of the conduction band of the electron transport layer and the light-absorbing layer. This allows the energy barrier of electrons migrating from the light-absorbing layer to the electron transport layer to be small. In this way, C60-SAM provided in the lead perovskite solar cell decreases the fluorescence lifetime of the solar cell. On the other hand, as shown in Table 1, in the solar cell according to the present disclosure, the intermediate layer containing C60-SAM is provided to increase the fluorescence lifetime of the solar cell. This result reveals that the effect provided by C60-SAM in the tin perovskite solar cell is different from the effect provided by C60-SAM in the lead perovskite solar cell. In particular, in the tin perovskite solar cell, the fullerene derivative is introduced between the tin perovskite compound and the electron transport material to weaken the electronic interaction between the tin perovskite compound and the electron transport material. The introduction provides the effect that the large interface defect level is prevented from being generated between the upper end of the valence band and the lower end of the conduction band, namely, the effect that the defect level is made small. In the tin perovskite solar cell, since the large energy level is made absent between the upper end of the valence band and the lower end of the conduction band to suppress the deactivation of the electrons through this level. As a result, it is believed that the characteristic is improved.

As demonstrated in the inventive examples 4-6, if the intermediate layer 4 contains fullerene C60 and the molar ratio of carbon to tin in the intermediate layer 4 is not less than 74% and not more than 408%, high open voltage is provided. If the molar ratio is not less than 74% and not more than 212%, higher open voltage is provided (see the inventive examples 4 and 5).

As understood from the comparison of the comparative example 1 to the comparative examples 2 and 3, if the intermediate layer in which a compound which does not contain a fullerene group is used is provided, the open voltage is rather lowered. The present inventors believe that this is because the compounds used in the comparative examples 2 and 3 interact with Sn atoms contained in the tin perovskite compound to increase the large defect level derived from the Sn vacancies, unlike fullerene and the derivative thereof. In addition, since the compounds used in the comparative examples 2 and 3 are poor in the electron conductivity, the voltage taken out is lowered. As above, since fullerene and the derivative thereof have low interaction and high electron conductivity, fullerene and the derivative thereof improve the open voltage.

INDUSTRIAL APPLICABILITY

The solar cell according to the present disclosure is disposed, for the example, on a roof.

REFERENTIAL SIGNS LIST

1 Substrate
2 First electrode
3 Electron transport layer
4 Intermediate layer
5 Light-absorbing layer
6 Hole transport layer
7 Second electrode
8 Porous layer
100, 200 Solar cell

The invention claimed is:

1. A solar cell, comprising:
a first electrode;
a second electrode;
a light-absorbing layer located between the first electrode and the second electrode; and
an intermediate layer located between the light-absorbing layer and at least one electrode selected from the group consisting of the first electrode and the second electrode, wherein:
the light-absorbing layer contains a tin fluoride and a perovskite compound represented by a chemical formula $ASnI_3$, where A is a monovalent cation, the tin fluoride is a separate compound from the perovskite compound, and a molar ratio of the tin fluoride to the perovskite compound is not less than 5% and not more than 20%,
the intermediate layer is in direct contact with the light-absorbing layer,
the at least one electrode selected from the group consisting of the first electrode and the second electrode has light-transmissive property,
the intermediate layer contains at least one selected from the group consisting of (4-(1',5'-dihydro-1'-methyl-2'H-[5,6]fullereno-C60-Ih-[1,9-c]pyrrol-2'-yl)benzoic acid) and fullerene C60,
the intermediate layer includes a tin element, and
a molar ratio of carbon to tin in the intermediate layer is not less than 35% and not more than 408%.

2. The solar cell according to claim 1, wherein a mass spectrum of the intermediate layer has a first peak located at a mass number of 720.

3. The solar cell according to claim 1, wherein the intermediate layer contains fullerene C60, and the molar ratio of carbon to tin in the intermediate layer is not less than 74% and not more than 408%.

4. The solar cell according to claim 1, wherein the intermediate layer contains (4-(1',5'-dihydro-1'-methyl-2'H-[5,6]fullereno-C60-Ih-[1,9-c]pyrrol-2'-yl)benzoic acid), and the molar ratio of carbon to tin in the intermediate layer is not less than 51% and not more than 109%.

5. The solar cell according to claim 1, wherein the molar ratio of carbon to tin in the intermediate layer is not less than 51% and not more than 110%.

6. The solar cell according to claim 1, further comprising:
an electron transport layer between the light-absorbing layer and the first electrode,
wherein the intermediate layer is located between the light-absorbing layer and the electron transport layer.

7. The solar cell according to claim 1, further comprising:
a hole transport layer between the light-absorbing layer and the second electrode.

8. A solar cell, comprising:
a first electrode;
a second electrode;
a light-absorbing layer located between the first electrode and the second electrode;
an intermediate layer located between the light-absorbing layer and at least one electrode selected from the group consisting of the first electrode and the second electrode; and
an electron transport layer located between the light-absorbing layer and the first electrode, and the electron transport layer is different from the intermediate layer, wherein:
the light-absorbing layer contains a tin fluoride and a perovskite compound represented by a chemical formula $ASnI_3$, where A is a monovalent cation, the tin fluoride is a separate compound from the perovskite compound, and a molar ratio of the tin fluoride to the perovskite compound is not less than 5% and not more than 20%,
the intermediate layer is in direct contact with the light-absorbing layer,
the at least one electrode selected from the group consisting of the first electrode and the second electrode has light-transmissive property,
the intermediate layer contains (4-(1',5'-dihydro-1'-methyl-2'H-[5,6]fullereno-C60-Ih-[1,9-c]pyrrol-2'-yl)benzoic acid) or the combination of (4-(1',5'-dihydro-1'-methyl-2'H-[5,6]fullereno-C60-Ih-[1,9-c]pyrrol-2'-yl)benzoic acid) and fullerene C60,
the intermediate layer includes a tin element, and
a molar ratio of carbon to tin in the intermediate layer is not less than 35% and not more than 408%.

9. The solar cell according to claim 8, wherein the electron transport layer is formed of $TiO_2$.

* * * * *